(12) United States Patent
Inagaki et al.

(10) Patent No.: US 10,667,430 B2
(45) Date of Patent: May 26, 2020

(54) VAPOR CHAMBER

(71) Applicant: FURUKAWA ELECTRIC CO., LTD., Tokyo (JP)

(72) Inventors: Yoshikatsu Inagaki, Tokyo (JP); Kenya Kawabata, Tokyo (JP); Hirofumi Aoki, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/236,887

(22) Filed: Dec. 31, 2018

(65) Prior Publication Data

US 2019/0141855 A1 May 9, 2019

Related U.S. Application Data

(63) Continuation of application No. PCT/JP2017/024068, filed on Jun. 30, 2017.

(30) Foreign Application Priority Data

Jul. 1, 2016 (JP) .................................. 2016-131801

(51) Int. Cl.
 *H05K 7/20* (2006.01)
 *H01L 23/427* (2006.01)
 (Continued)

(52) U.S. Cl.
 CPC ..... *H05K 7/20336* (2013.01); *F28D 15/0233* (2013.01); *F28D 15/046* (2013.01); *F28F 21/081* (2013.01); *H01L 23/427* (2013.01)

(58) Field of Classification Search
 CPC .......................... H05K 7/20336; H01L 23/427
 (Continued)

(56) References Cited

U.S. PATENT DOCUMENTS 8,243,449 B2 * 8/2012 Oniki .................... F28D 1/0391
                                                                 165/104.21
2004/0011509 A1    1/2004 Siu
                (Continued)

FOREIGN PATENT DOCUMENTS

CN          202221259 U    10/2009
JP          11-23167 A      1/1999
                (Continued)

OTHER PUBLICATIONS

International Preliminary Report on Patentability and English translation of the Written Opinion of the International Searching Authority (Forms PCT/IB/373 and PCT/ISA/237) for International Application No. PCT/JP2017/024068, dated Jan. 1, 2019.
(Continued)

*Primary Examiner* — Mukundbhai G Patel
(74) *Attorney, Agent, or Firm* — Birch, Stewart, Kolasch & Birch, LLP

(57) ABSTRACT

Provided is a vapor chamber that is extremely thin but nonetheless allows a working fluid to smoothly flow back, prevents dry-out and provides a superior heat transport capability, regardless of an installation orientation such as a top heat orientation or a change in the installation orientation. A vapor chamber has a container having a hollow portion, the hollow portion being formed by one plate-shaped body and another plate-shaped body facing the one-plate shaped body; a working fluid enclosed in the hollow portion; a first wick structure provided in the hollow portion; and a second wick structure on an inner surface of the one plate-shaped body thermally connected to a heating element, the second wick structure having a lower flow path resistance to the working fluid than the first wick structure, the second wick structure including a groove portion, wherein a vapor flow path is provided inside of the other plate-shaped body, the first wick structure is provided
(Continued)

between the other plate-shaped body and the second wick structure, and an aperture size of the first wick structure is 75% or more of a groove width of the second wick structure and an open area rate of the first wick structure is 35% or more.

6 Claims, 8 Drawing Sheets

(51) Int. Cl.
  *F28D 15/02* (2006.01)
  *F28D 15/04* (2006.01)
  *F28F 21/08* (2006.01)
(58) Field of Classification Search
  USPC ......................................................... 361/700
  See application file for complete search history.

(56) References Cited

U.S. PATENT DOCUMENTS

| | | | |
|---|---|---|---|
| 2007/0056711 A1 | 3/2007 | Ohsawa | |
| 2007/0240858 A1 | 10/2007 | Hou et al. | |
| 2008/0135214 A1 | 6/2008 | Ohsawa et al. | |
| 2010/0157535 A1* | 6/2010 | Oniki | F28D 15/0233 361/700 |

FOREIGN PATENT DOCUMENTS

| | | |
|---|---|---|
| JP | 2005-525529 A | 8/2005 |
| JP | 2007-315745 A | 12/2007 |
| JP | 2010-151354 A | 7/2010 |
| JP | 2012-184875 A | 9/2012 |
| JP | 2015-59693 A | 3/2015 |
| TW | 200722702 A | 6/2007 |
| TW | 200742829 A | 11/2007 |
| WO | WO 2008/146129 A2 | 12/2008 |
| WO | WO 2009/119289 A1 | 10/2009 |

OTHER PUBLICATIONS

Decision to grant issued in a counterpart Taiwan Patent Application No. 106122198, dated Nov. 20, 2018.
International Search Report (PCT/ISA/210) issued in PCT/JP2017/024068, dated Sep. 12, 2017.
Notice of reason for rejection issued in a counterpart Taiwan Patent Application No. 106122198, dated Mar. 15, 2018.
Written Opinion (PCT/ISA/237) issued in PCT/JP2017/024068, dated Sep. 12, 2017.
Decision to Grant a Patent dated Oct. 29, 2019 in corresponding Japanese Patent Application No. 2018-525284, with English translation.
Japanese Office Action dated Jun. 3, 2019, for corresponding Japanese Application No. 2018-525284, with English translation.
Chinese Office Action, dated Aug. 7, 2019 for corresponding Chinese Application No. 201790000989.3, with an English translation.
Japanese Office Action, dated Aug. 13, 2019, for corresponding Japanese Application No. 2018-525284, with an English translation.
Chinese Notification to Grant for corresponding Chinese Application No. 201790000989.3, dated Nov. 26, 2019, with English translation.

* cited by examiner

| No. | ONE PLATE-SHAPED BODY | THE OTHER PLATE-SHAPED BODY | MESH (FIRST WICK STRUCTURE) | FLOW PATH MESH | MAXIMUM HEAT TRANSPORT AMOUNT |
|---|---|---|---|---|---|
| 1 | MICROETCHING | NO ETCHING | 60μm~150MESH | 100μm~100MESH ROLLED THREE LAYERS | 10W |
| 2 | NO MICROETCHING | NO ETCHING | NONE | 100μm~100MESH ROLLED FOUR LAYERS | 15W |
| 3 | MICROETCHING | NO ETCHING | NONE | 100μm~100MESH ROLLED FOUR LAYERS | 20W |
| 4 | MICROETCHING | NO ETCHING | NONE | 60μm~150MESH FOUR LAYERS | 10W |
| 5 | MICROETCHING (SECOND WICK STRUCTURE) | 3mmPITCH SUPPORTING COLUMN MEMBER | 50μm~200MESH | NONE | 50W OR GREATER |
| 6 | MICROETCHING (SECOND WICK STRUCTURE) | 3.5mmPITCH SUPPORTING COLUMN MEMBER | 60μm~150MESH | NONE | 45W OR GREATER |
| 7 | MICROETCHING (SECOND WICK STRUCTURE) | 4mmPITCH SUPPORTING COLUMN MEMBER | 60μm~150MESH | NONE | 50W OR GREATER |

FIG.8

VAPOR CHAMBER

CROSS REFERENCE TO RELATED APPLICATIONS

This is a continuation application of international patent Application No. PCT/JP2017/024068 filed Jun. 30, 2017, which claims the benefit of Japanese Patent Application No. 2016-131801, filed Jul. 1, 2016, the full contents of both of which are hereby incorporated by reference in their entirety.

BACKGROUND

Technical Field

The present disclosure is related to a vapor chamber that is extremely thin but nonetheless allows a working fluid to smoothly flow back, prevents dry-out and provides a superior heat transport capability, regardless of an installation orientation such as a top heat orientation or a change in the installation orientation.

Background

Electronic components, such semiconductor elements, mounted on electric and electronic devices tend to generate more heat for reasons such as high density mounting to provide high functionality, and cooling of these electronic components has been increasingly important in recent years. As a method for cooling the electronic components, a vapor chamber or a planar heat pipe is used in some cases.

Since a planar heat pipe has a small dimension in a thickness direction, the planar heat pipe is required to have a wick for allowing a working fluid in liquid phase to smoothly flow back to a heat receiving portion, and a vapor flow path that allows a working fluid in vapor phase to smoothly spread in a surface direction. For example, International Publication No. WO2009/119289 discloses a planar heat pipe including plural flat plate-like intermediate plates stacked on each other between an upper plate and a lower plate and having internal through holes. Only a part of each through hole is overlapped on each other to form a capillary flow path having a cross-sectional area smaller than a cross-sectional area of the through hole in a flat surface direction. As such, in the heat pipe of International Publication No. WO2009/119289, the intermediate plates stacked on each other are filled in between the upper plate and the lower plate, and thus a vapor flow path is not formed in an internal space between the upper plate and the stacked intermediate plates or between the lower plate and the stacked intermediate plates.

Further, in the heat pipe of International Publication No. WO2009/119289, a cutout portion formed in each of the plural intermediate plates is overlapped on each other to thereby form a vapor flow path. That is, the vapor flow path is formed by the cutout portions provided in the respective stacked intermediate plates. Accordingly, in the heat pipe of International Publication No. WO2009/119289, not only the capillary flow path but also the vapor flow path extend in the stacking direction of the intermediate plates.

As described above, in the planar heat pipe of International Publication No. WO2009/119289, the vapor flow path is not formed in a surface direction but in the stacking direction of the intermediate plates. This hinders the working fluid in vapor phase from smoothly spreading in the surface direction, which results in a failure to obtain a favorable heat transport capability. Further, in the heat pipe of International Publication No. WO2009/119289, in which both the capillary flow path and the vapor flow path extend in the staking direction of the intermediate plates, the working fluid may hardly flow back depending on an installation orientation such as a top heat orientation or a change in the installation orientation, and thus dry-out may occur.

To improve a heat transport capability, National Publication of International Patent Application No. 2005-525529 proposes a cooling device including a base chamber and a fin chamber. In each of the base chamber and the fin chamber, a multi-layered wick structure is provided. However, the cooling device of National Publication of International Patent Application No. 2005-525529 is not a planar device and is difficult to install in a narrow space. Also, since the working fluid in vapor phase flows through a vapor cavity, the working fluid in vapor phase cannot smoothly spread in the surface direction of the chamber.

Further, Japanese Patent Application Laid-Open No. 2015-59693 proposes a sheet-type heat pipe formed by stacking two or more metal sheets each having a groove formed by etching the surface. The groove serves as a wick defining a vapor path and a working liquid path. However, in the heat pipe of Japanese Patent Application Laid-Open No. 2015-59693, the region for the vapor path and the region for the working liquid path are partitioned from each other on a plane, and thus the working fluid in vapor phase cannot smoothly spread in the surface direction. This results in a failure to obtain a favorable heat transport capability.

Also, Japanese Patent Application Laid-Open No. 11-23167 proposes a vapor chamber having a superior heat transport capability even in a top heat mode. A groove portion communicating an evaporating portion and a condensing portion of a container is formed on an inner surface of the container, and a porous layer producing a capillary force is attached so as not to fill an internal space of the groove portion. However, in the vapor chamber of Japanese Patent Application Laid-Open No. 11-23167, the porous layer is a thermally sprayed coating film, which has a high flow path resistance. This makes it hard to smoothly flow back the working fluid, leading to a failure to obtain a favorable heat transport capability. Further, in the vapor chamber of Japanese Patent Application Laid-Open No. 11-23167, since the porous layer is provided so as to cover an opening of the groove portion, the working fluid in vapor phase is insufficiently released from the porous layer. This hinders the working fluid in vapor phase from smoothly flowing to the vapor flow path.

SUMMARY

The present disclosure is related to providing a vapor chamber that is extremely thin but nonetheless allows a working fluid to smoothly flow back, prevents dry-out and provides a superior heat transport capability, regardless of an installation orientation such as a top heat orientation or a change in the installation orientation.

According to a first aspect of the present disclosure, a vapor chamber includes: a container having a hollow portion, the hollow portion being formed by one plate-shaped body and another plate-shaped body facing the one-plate shaped body; a working fluid enclosed in the hollow portion; a first wick structure provided in the hollow portion; and a second wick structure on an inner surface of the one plate-shaped body thermally connected to a heating element, the second wick structure having a lower flow path resistance to the working fluid than the first wick structure, the second wick structure including a groove portion, wherein a vapor flow path is provided inside of the other plate-shaped body, the first wick structure is provided between the other plate-shaped body and the second wick structure, an aperture size of the first wick structure is 75% or more of a groove width of the second wick structure, and an open area rate of the first wick structure is 35% or more.

In the first aspect, the first wick structure inserted through the hollow portion has a higher flow path resistance to the working fluid in liquid phase than the second wick structure formed on the inner surface of the one plate-shaped body (namely, the inner surface of the one plate-shaped body in the hollow portion). Thus, the working fluid in liquid phase is caused to flow back from a heat releasing portion to a heat receiving portion via the second wick structure formed on the inner surface of the one plate-shaped body, rather than via the first wick structure inserted through the hollow portion. Accordingly, the first wick structure inserted through the hollow portion is more apt to retain the working fluid in liquid phase than the second wick structure formed on the inner surface of the one plate-shaped body, while having a function of causing the working fluid in liquid phase to flow back from the heat releasing portion to the heat receiving portion. Further, in the first aspect, since the first wick structure does not have a passage for allowing only the working fluid in vapor phase to flow therethrough at the heat receiving portion, the first wick structure is not provided with a cutout portion and the like defining a vapor flow path at a portion corresponding to the heat receiving portion.

Further, in the first aspect, since the aperture size of the first wick structure is 75% or more of the groove width of the second wick structure and the open area rate of the first wick structure is 35% or more, bubbles formed during a phase change of the working fluid from liquid to vapor in response to the vapor chamber receiving heat from the heating element are smoothly released through aperture portions of the first wick structure and flow to the vapor flow path.

According to a second aspect of the present disclosure, in the vapor chamber, the first wick structure is arranged on the second wick structure.

According to a third aspect of the present disclosure, in the vapor chamber, the second wick structure includes a lattice-shaped groove structure, and the lattice-shaped groove structure is provided on an entire inner surface of the hollow portion, or on a portion of the hollow portion corresponding to a heat receiving portion and/or a portion of the hollow portion corresponding to a heat releasing portion.

According to a fourth aspect of the present disclosure, in the vapor chamber, a supporting column member is provided on an inner surface of the other plate-shaped body so as to protrude from the inner surface of the other plate-shaped body.

In the fourth aspect, the supporting column member functions as a member for maintaining an internal space of the depressurized hollow portion.

According to a fifth aspect of the present disclosure, in the vapor chamber, the supporting column member includes a groove extending from a top portion of the supporting column member to a bottom portion of the supporting column member.

According to a sixth aspect of the present disclosure, in the vapor chamber, the supporting column member includes a groove helically extending from a top portion of the supporting column member to a bottom portion of the supporting column member.

According to a seventh aspect of the present disclosure, in the vapor chamber, the supporting column member includes a lattice-shaped groove on a side surface portion of the supporting column member.

According to an eighth aspect of the present disclosure, a mobile electronic device includes a heating element thermally connected to the vapor chamber of the above aspects.

According to the vapor chamber of the present disclosure, since the working fluid in liquid phase is easily retained in the first wick structure inserted through the hollow portion, the first wick structure located at the heat receiving portion of the vapor chamber can retain the working fluid in liquid phase regardless of an installation orientation such as a top heat orientation or a change in the installation orientation depending on usage conditions, and this can prevent dry-out.

According to the vapor chamber of the present disclosure, since the aperture size of the first wick structure is 75% or more of the groove width of the second wick structure and the open area rate of the first wick structure is 35% or more, the working fluid in vapor phase can be smoothly released through aperture portions of the first wick structure and flow to the vapor flow path without impairing the condensing capability of the working fluid in changing from vapor to liquid. This ensures a superior fluidity of the working fluid in vapor phase, as a result of which a superior heat transport capability can be obtained.

Further, according to the vapor chamber of the present disclosure, since the second wick structure formed on the inner surface of the one plate-shaped body has a lower flow path resistance, the working fluid in liquid phase retained in the first wick structure and the working fluid in liquid phase condensed at the heat releasing portion of the vapor chamber are smoothly transported by the second wick structure from the heat releasing portion toward the heat receiving portion, regardless of an installation orientation such as a top heat orientation or a change in the installation orientation depending on usage conditions. Further, according to the vapor chamber of the present disclosure, since at least a portion of the first wick structure corresponding to the heat receiving portion is not provided with a vapor flow path and a vapor flow path is provided between the inner surface of the other plate-shaped body and the first wick structure, the working fluid in vapor phase can smoothly flow over an entire area in a surface direction through the vapor flow path. As such, the working fluid in liquid phase smoothly flows from the heat releasing portion toward the heat receiving portion by virtue of the second wick structure and the working fluid in vapor phase can smoothly flow from the heat receiving portion toward the entire area in the surface direction, and the heat transport capability is thereby improved regardless of an installation orientation or a change in the installation orientation depending on usage conditions.

According to the vapor chamber of the present disclosure, the first wick structure is arranged on the second wick structure, and this prevents dry-out while allowing the vapor chamber to be thinner.

According to the vapor chamber of the present disclosure, the wick structure includes a lattice-shaped groove structure and the lattice-shaped groove structure is provided on the entire inner surface of the hollow portion, or a portion of the hollow portion corresponding to the heat receiving portion and/or a portion of the hollow portion corresponding to the heat releasing portion, and this allows to make the working fluid in liquid phase smoothly flow back from the heat releasing portion to the heat receiving portion.

According to the vapor chamber of the present disclosure, the supporting column member is provided on the inner surface of the other plate-shaped body so as to protrude from the inner surface of the other plate-shaped body, and this allows to maintain the internal space of the depressurized hollow portion while forming the vapor flow path over the entire area in the surface direction.

According to the vapor chamber of the present disclosure, since the groove is formed on the supporting column member, the capillary force of the groove causes the working fluid in liquid phase to be transported from the wick structure toward the other plate-shaped body and also causes the working fluid in vapor phase flowing in the vapor flow path to flow toward the other plate-shaped body. Accordingly, the heat transmitted from the heating element to the heat receiving portion can also be released to an external environment through the other plate-shaped body.

BRIEF DESCRIPTION OF THE DRAWINGS

FIG. 8 is a table showing internal structures of the vapor chambers of the examples and evaluation results.

DETAILED DESCRIPTION

Figure 1:
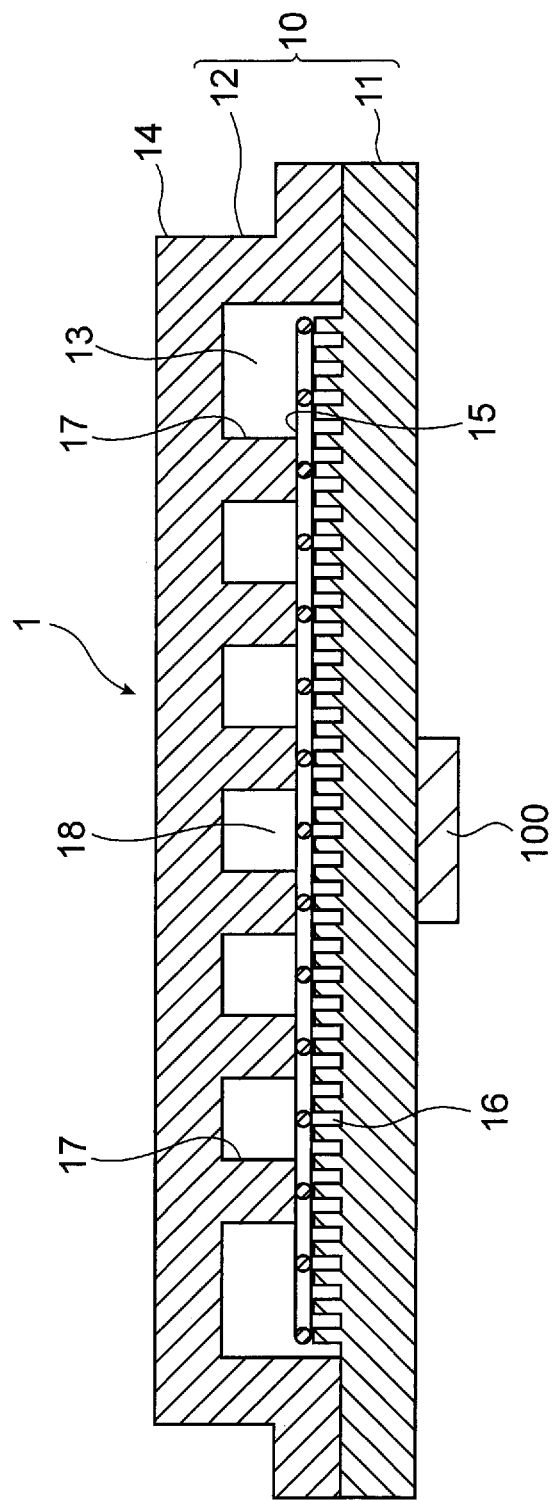
FIG. 1 is a side sectional view of a vapor chamber according to an embodiment of the present disclosure.

Hereinafter, embodiments of the present disclosure will be described with reference to the accompanying drawings. As shown in FIG. 1, a vapor chamber 1 according to an embodiment of the present disclosure includes a container 10 of a rectangular shape in a plan view (as viewed from a vertical direction with respect to a plane of the vapor chamber 1), and a working fluid (not shown). The container 10 includes two opposing plate-shaped bodies, namely one plate-shaped body 11 and another plate-shaped body 12 facing the one plate-shaped body 11, that are placed on top of each other to thereby form a hollow portion 13. The working fluid is enclosed in the hollow portion 13. A first wick structure 15 having a capillary structure is accommodated in an internal space of the hollow portion 13. A space portion between an inner surface of the other plate-shaped body 12 and the first wick structure 15 defines a vapor flow path 18 in which the working fluid in vapor phase flows.

The one plate-shaped body 11 has a flat plate shape. The other plate-shaped body 12 also has a flat plate shape and its central part is plastically deformed into a protruding shape. The portion of the other plate-shaped body 12 projecting outward and plastically deformed into the protruding shape defines a protruding part 14 of the container 10. The hollow portion 13 is defined inside the protruding part 14. The hollow portion 13 is depressurized by a deaeration treatment.

A second wick structure 16 is formed on an inner surface of the one plate-shaped body 11 corresponding to the hollow portion 13. Examples of the second wick structure 16 include a structure having narrow grooves formed in a lattice shape, namely a lattice-shaped groove portion. In the vapor chamber 1, the second wick structure 16 (lattice-shaped groove portion) is formed on a substantially entire area of the inner surface of the one plate-shaped body 11 corresponding to the hollow portion 13. The second wick structure 16 as the lattice-shaped groove portion is adjusted in its narrow groove width and depth and its intervals between the narrow grooves (namely, a width of a protruding part of a rectangular shape formed between the narrow grooves) such that the second wick structure 16 has a lower flow path resistance to the working fluid in liquid phase than the first wick structure 15 accommodated in the hollow portion 13. Although the form of the lattice-shaped groove portion is not particularly limited as long as the lattice-shaped groove portion has a lower flow path resistance to the working fluid in liquid phase than the first wick structure 15, it is preferable that, for example, the width of the narrow groove be 10 μm to 100 μm, the depth of the narrow groove be 10% to 65% of the thickness of the one plate-shaped body 11, and the width of the protruding part be 10 μm to 200 μm×10 μm to 200 μm.

The method for forming the lattice-shaped groove portion is not particularly limited, and examples of the method include forming the lattice-shaped groove portion by applying a microetching treatment, a blast treatment or a roughening plating treatment to the inner surface of the one plate-shaped body 11.

The first wick structure 15 accommodated in the hollow portion 13 is a member having a higher flow path resistance to the working fluid in liquid phase than the second wick structure 16 (the lattice-shaped groove portion in the vapor chamber 1) formed on the inner surface of the one plate-shaped body 11. The form of the first wick structure 15 is not particularly limited as long as the first wick structure 15 has a higher flow path resistance to the working fluid in liquid phase than the second wick structure 16 (lattice-shaped groove portion), and examples of the first wick structure 15 include a metal mesh composed of metal wires such as copper, copper alloy, aluminum, aluminum alloy, titanium and titanium alloy, graphite fiber, a sintered sheet formed by sintering metal powders such as copper powders, nonwoven fabric, and a graphite sheet. Also, the thickness of the first wick structure 15 is, for example, 0.1 mm. In the vapor chamber 1, the first wick structure 15 is arranged in contact with a surface of the lattice-shaped groove portion 16. This can prevent dry-out while allowing the vapor chamber 1 to be thinner.

Further, a lower limit of an aperture size of the first wick structure 15 is preferably 75%, and particularly preferably 90%, of a groove width of the lattice-shaped groove portion of the second wick structure 16, in terms of ensuring releasability of the working fluid in vapor phase. On the other hand, an upper limit of the aperture size of the first wick structure 15 is preferably 150% of the groove width in terms of producing a capillary force. A lower limit of an open area rate of the first wick structure 15 is preferably 35%, and particularly preferably 45%, in terms of ensuring releasability of the working fluid in vapor phase. On the other hand, an upper limit of the open area rate of the first wick structure 15 is preferably 70% in terms of producing a capillary force.

The above "aperture size" is a value calculated from:
Aperture size (A) (mm)=(25.4/mesh number (M))−wire diameter (d) (mm). Also, the above "open area rate" is a value calculated from: Open area rate (%)=(A/(A+d))²×100.

Since the vapor flow path 18 in which the working liquid in vapor phase flows is defined by the space portion between the inner surface of the other plate-shaped body 12 and the first wick structure 15 in the vapor chamber 1, the first wick structure 15 is not provided with a vapor flow path and thus a cutout portion and the like defining a vapor flow path is not formed in the first wick structure 15.

Further, a flow path resistance of the metal mesh can be adjusted by selecting an aperture of the metal mesh and a wire diameter of the metal wires as appropriate. Examples of the structure of the metal mesh having a higher flow path resistance than the lattice-shaped groove portion include a wire diameter of 50 μm to 100 μm and 50 to 200 mesh.

As shown in FIG. 1, the inner surface of the other plate-shaped body 12 corresponding to the hollow portion 13 is provided with supporting column members 17 protruding from the inner surface. The supporting column members 17 extend in a direction to the one plate-shaped body 11 and contact the first wick structure 15. The supporting column members 17 have a function of maintaining the internal space of the depressurized hollow portion 13. Examples of the supporting column members 17 include a supporting column made of metal, a punching plate, and a net made of metal and having a large opening rate.

Figure 2:
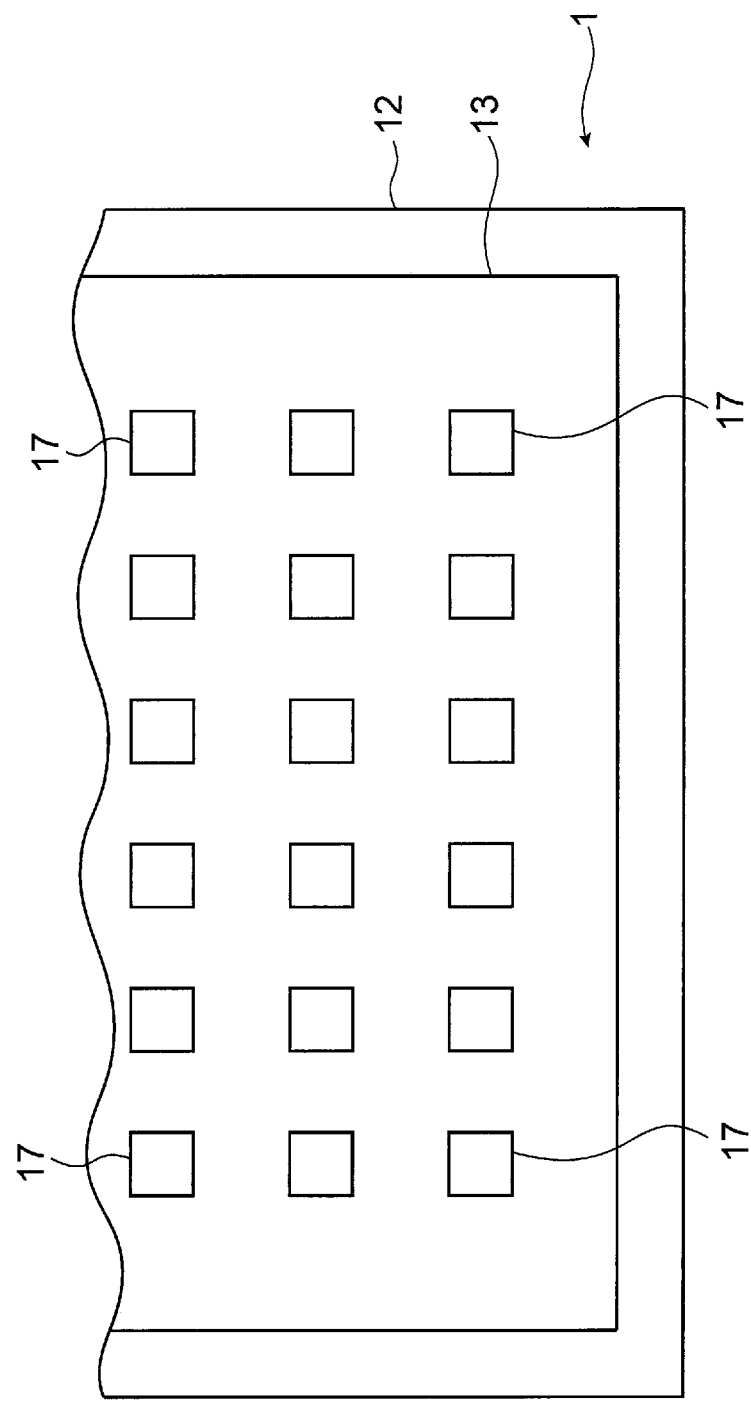
FIG. 2 is a diagram explaining an inside of a hollow portion of the vapor chamber according to the embodiment of the present disclosure.

The shape of the supporting column members 17 in a plan view (as viewed from a vertical direction with respect to a plane of the vapor chamber 1) is not particularly limited and may be a round shape, a rectangular shape and the like. In the vapor chamber 1, the supporting column members 17 each have a rectangular shape as shown in FIG. 2. Plural supporting column members 17 are arranged in parallel at predetermined intervals along a longitudinal direction and a lateral direction of the inner surface of the other plate-shaped body 12. Since the space portion between the supporting column members 17 defines the vapor flow path 18, the vapor flow path 18 is formed over an entire area in a surface direction of the vapor chamber 1. The height of the supporting column members 17 is selected as appropriate according to the thickness of the vapor chamber 1, the thickness of the one plate-shaped body 11 and the other plate-shaped body 12 and the thickness of the first wick structure 15, and for example 0.1 mm to 0.8 mm.

Examples of the material of the container 10 include copper, copper alloy, aluminum, aluminum alloy, nickel, nickel alloy, stainless steel and titanium. The thickness of the vapor chamber 1 is, for example, 0.3 mm to 1.0 mm and the thickness of each of the one plate-shaped body 11 and the other plate-shaped body 12 is, for example, 0.1 mm.

The container 10 is formed by joining peripheral portions of the one plate-shaped body 11 and the other plate-shaped body 12. The method for joining is not particularly limited, and examples of the method include diffusion bonding, brazing, laser welding, ultrasonic welding, friction welding and pressure welding. The joining width is, for example, more than 0.3 mm to 2.5 mm.

The working fluid to be enclosed in the hollow portion 13 can be selected as appropriate according to compatibility with the material of the container 10, and examples of the working fluid include water. Examples further include fluorocarbon such as alternative chlorofluorocarbon and fluorinert, cyclopentane, ethylene glycol and a mixture of any of these compounds and water.

Next, an operation of the vapor chamber 1 according to the embodiment of the present disclosure will be explained with reference to FIG. 1. In the vapor chamber 1, a portion thermally connected to a heating element 100 functions as a heat receiving portion. When the vapor chamber 1 receives heat from the heating element 100, the working fluid in liquid phase enclosed in the hollow portion 13 changes from liquid phase to vapor phase at the heat receiving portion, is released from the second wick structure 16, passes through the apertures of the first wick structure 15 and flows in the vapor flow path 18 to move to a heat releasing portion of the vapor chamber 1. At this time, since the aperture width of the first wick structure 15 is 75% or more of the groove width of the second wick structure 16, phase change of the working fluid to vapor phase and release of the bubbles are efficiently conducted, and thereby a heat transport capability of the vapor chamber 1 is remarkably increased. The working fluid in vapor phase having moved to the heat releasing portion releases latent heat at the heat releasing portion and changes from vapor phase to liquid phase. The latent heat released at the heat releasing portion is released further to an external environment. The working fluid having changed from vapor phase to liquid phase at the heat releasing portion is caused to flow back to the heat receiving portion mainly by the second wick structure 16, which has a lower flow path resistance than the first wick structure 15. As such, the second wick structure 16 has a function of causing the working fluid in liquid phase to flow back from the heat releasing portion to the heat receiving portion. On the other hand, the first wick structure 15, which has a higher flow path resistance than the second wick structure 16, has a function of causing the working fluid in liquid phase to flow back from the heat releasing portion to the heat receiving portion and also a function of retaining a certain amount of the working fluid in liquid phase.

Since the first wick structure 15 of the vapor chamber 1 has a function of retaining a certain amount of the working fluid in liquid phase as described above, the first wick structure 15 located at the heat receiving portion of the vapor chamber 1 can retain the working fluid in liquid phase even when the vapor chamber 1 is installed in a top heat orientation and the like or even when the installation orientation of the vapor chamber 1 changes depending on usage conditions. This can prevent dry-out.

Further, since the second wick structure 16 of the vapor chamber 1 formed on the inner surface of the one plate-shaped body 11 has a lower flow path resistance, the working fluid in liquid phase retained in the first wick structure 15 and the working fluid in liquid phase condensed at the heat releasing portion of the vapor chamber 1 are smoothly transported by the second wick structure 16 from the heat releasing portion toward the heat receiving portion. Further, since the vapor flow path 18 is provided over the entire area in the surface direction of the vapor chamber 1 between the inner surface of the other plate-shaped body 12, on which the supporting column members 17 are provided, and the first wick structure 15, the working fluid in vapor phase can smoothly flow over the entire area in the surface direction of the vapor chamber 1 via the vapor flow path 18. As such, the working fluid in liquid phase smoothly flows from the heat releasing portion to the heat receiving portion by virtue of the second wick structure 16, and the working fluid in vapor phase can smoothly flow from the heat receiving portion to the entire area in the surface direction by virtue of the vapor flow path 18. This provides a superior heat transport capability regardless of an installation orientation of the vapor chamber 1 and a change in the installation orientation of the vapor chamber 1 depending on usage conditions.

Then, another embodiment of the present disclosure will be explained. In the above embodiment, the supporting column members are provided on the inner surface of the other plate-shaped body. However, when the supporting column member is a supporting column made of metal, a capillary structure may be provided on a side surface of the supporting column member as necessary. Examples of the capillary structure include a recessed groove (groove) linearly extending from a top portion of the supporting column member to a bottom portion of the supporting column member, a recessed groove helically extending from the top portion of the supporting column member to the bottom portion of the supporting column member, and a recessed groove of a lattice shape formed on the side surface portion of the supporting column member. The recessed groove may be formed by etching, for example.

By the capillary force of the recessed groove formed along a height direction of the supporting column member, the working fluid in liquid phase is transported from the wick structure toward the other plate-shaped body too and the working fluid in vapor phase flowing in the vapor flow path is caused to flow toward the other plate-shaped body too. Accordingly, the heat transmitted from the heating element to the heat receiving portion can also be released from the other plate-shaped body to the external environment.

In the above embodiment, the second wick structure (lattice-shaped groove portion) is formed substantially on the entire area of the inner surface of the one plate-shaped body corresponding to the hollow portion. However, instead of this, the second wick structure may be formed only on a portion of the inner surface corresponding to the heat receiving portion, on a portion of the inner surface corresponding to the heat releasing portion, or on portions of the inner surface corresponding to the heat receiving portion and the heat releasing portion. With any of these forms too, the working fluid in liquid phase is transported by the second wick structure from the heat releasing portion toward the heat receiving portion, and a surface area of the heat receiving portion and/or the heat releasing portion on the inner surface can be increased, thereby enabling to improve a heat transport capability. Further, in a case where the second wick structure (lattice-shaped groove portion) is formed at the portions of the inner surface corresponding to the heat receiving portion and the heat releasing portion, a line groove may be provided on the inner surface and/or a side wall surface of the hollow portion between the heat receiving portion and the heat releasing portion so as to extend from the second wick structure (lattice-shape groove portion) on the heat releasing portion to the second wick structure (lattice-shape groove portion) on the heat receiving portion. With the line groove, the working fluid in liquid phase is caused to smoothly flow back from the heat releasing portion to the heat receiving portion regardless of an installation orientation such as a top heat orientation or a change in the installation orientation, even when the second wick structure (lattice-shaped groove portion) is not provided between the heat receiving portion and the heat releasing portion.

EXAMPLES

Next, examples of the present disclosure will be explained, though the present disclosure is not limited to these examples as long as the gist of the present disclosure is maintained.

Figure 3:
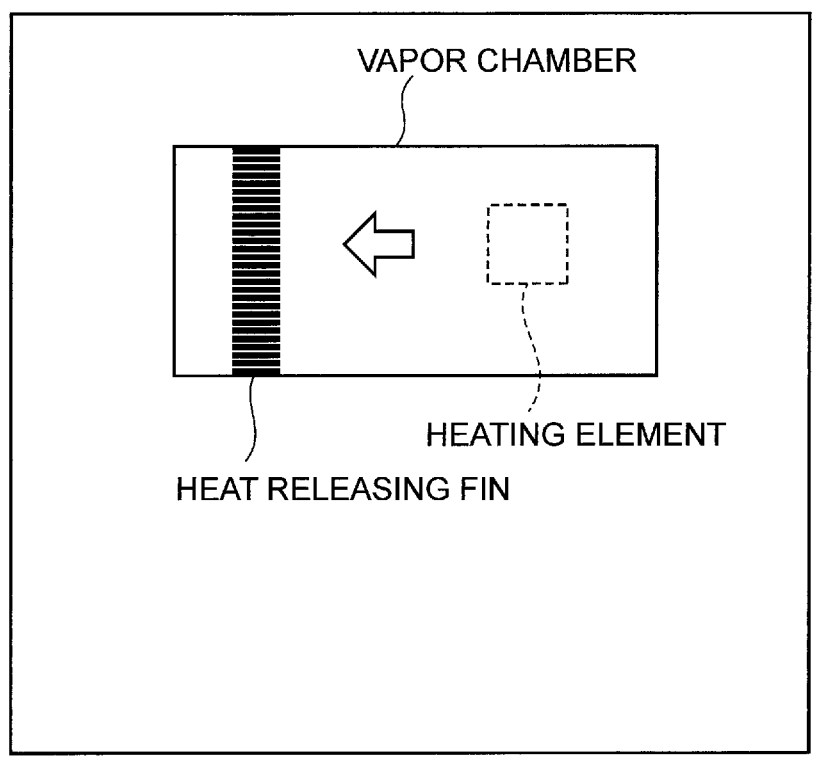
FIG. 3 is a diagram explaining a method for evaluating vapor chambers of examples.

Using a vapor chamber of 50 mm×100 mm×0.6 mm thickness (No. 1 to No. 7), a heating element was connected at a portion 10 mm away from one end portion, as shown in FIG. 3. Also, a heat releasing fin was thermally connected at a portion 10 mm away from another end portion opposite to the one end portion. Further, cooling wind was supplied to the heat releasing fin using a fan (not shown in the figure).

The amount of heat supplied from the heating element was incremented by 5 watts (W), and a value one notch before drying out was evaluated as the maximum heat transport amount. Occurrence of dry-out was judged by measuring a temperature distribution on a surface of each vapor chamber of No. 1 to No. 7 with infrared thermography. That is, a state where only a portion connected to the heating element and the vicinity of the portion on the surface of the vapor chamber have a high temperature was judged as having dry-out.

Figure 4:
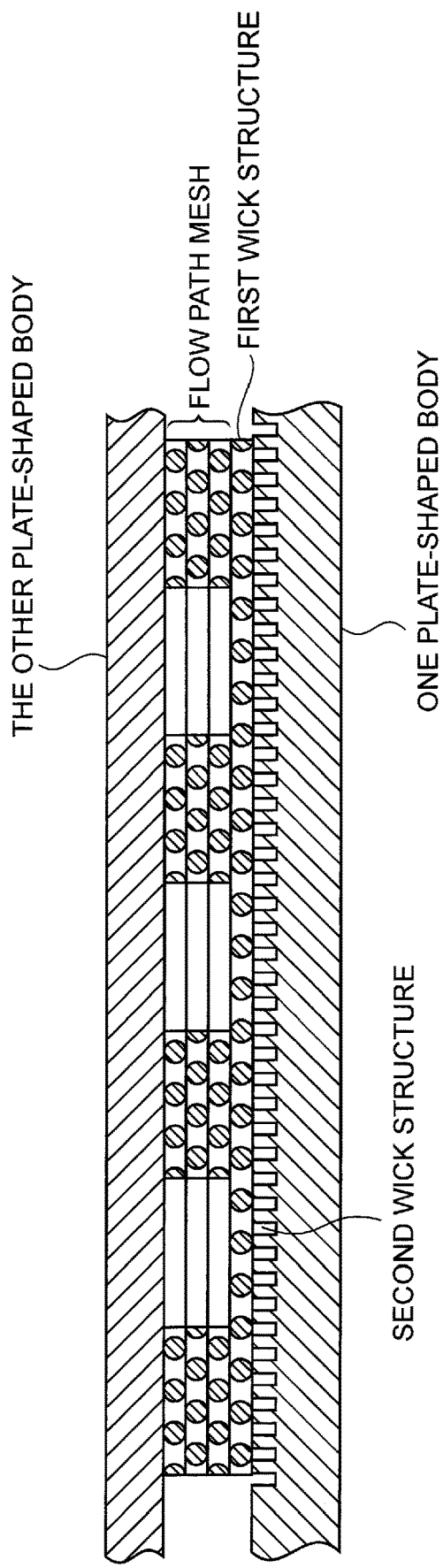
FIG. 4 is a diagram explaining an internal structure of a vapor chamber of No. 1 in the examples.
Figure 5:
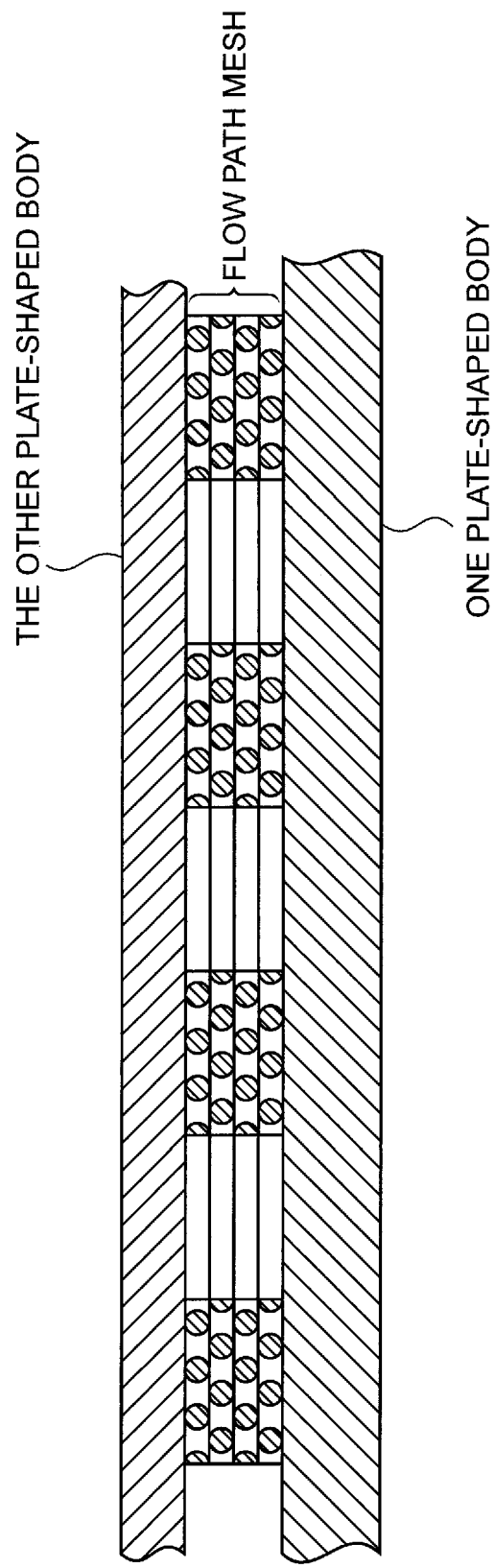
FIG. 5 is a diagram explaining an internal structure of a vapor chamber of No. 2 in the examples.
Figure 6:
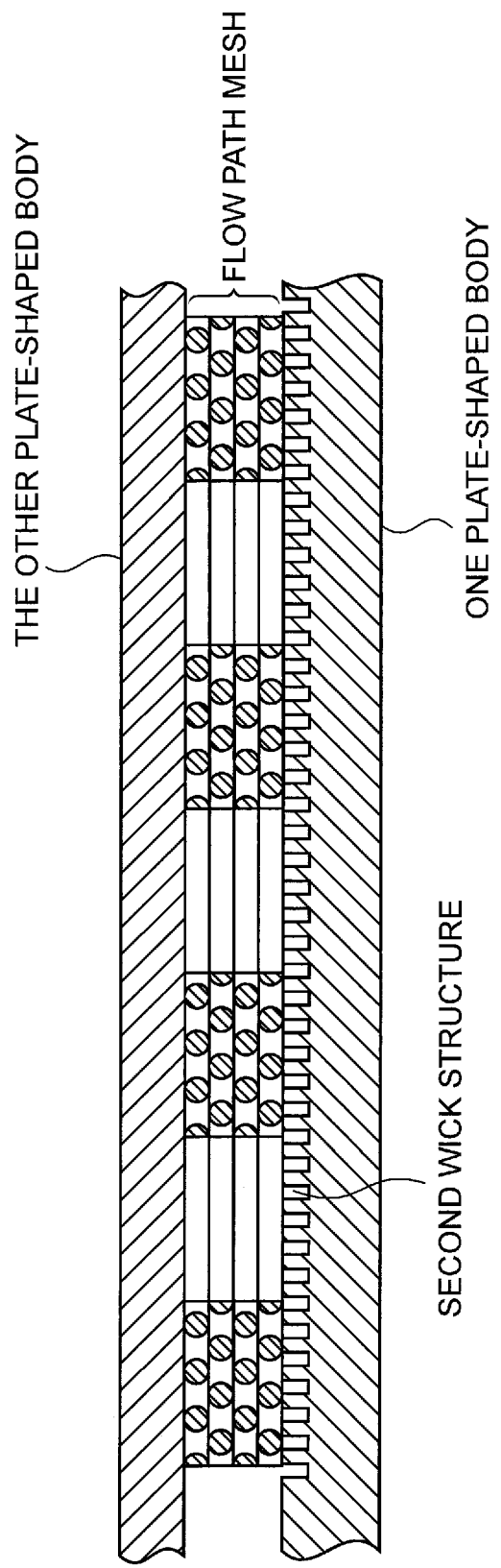
FIG. 6 is a diagram explaining an internal structure of vapor chambers of No. 3 and No. 4 in the examples.
Figure 7:
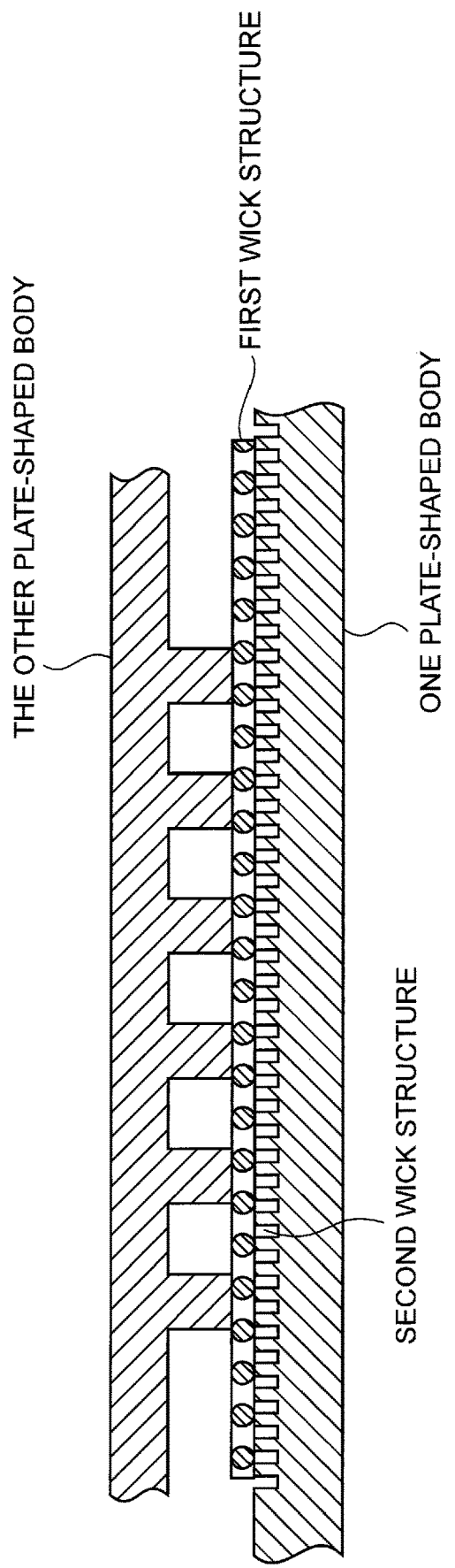
FIG. 7 is a diagram explaining an internal structure of vapor chambers of No. 5, No. 6 and No. 7 in the examples.

An internal structure of the vapor chamber of No. 1 (comparative example) is shown in FIG. 4, an internal structure of the vapor chamber of No. 2 (comparative example) is shown in FIG. 5, an internal structure of each of the vapor chambers of No. 3 and No. 4 (comparative examples) is shown in FIG. 6, and an internal structure of each of the vapor chambers of No. 5, No. 6 and No. 7 (examples) is shown in FIG. 7. Also, FIG. 8 summarizes presence/absence of the first wick structure and the second wick structure and their structures and presence/absence of the supporting column members and their structure for each internal structure of the vapor chambers of No. 1 to No. 7. The narrow groove of the second wick structure was 50 μm in width and 60 μm in depth, and the width of the protruding part was 100 μm×100 μm.

The results of the maximum heat transport amount of the vapor chambers of No. 1 to No. 7 are shown in FIG. 8.

FIG. 8 shows that the maximum heat transport amount of 45 W or greater, or 50 W or greater, was obtained from the vapor chambers of No. 5, No. 6 and No. 7, which are the examples that include the first wick structure and the second wick structure and have the internal space maintained by the supporting column members.

On the other hand, the maximum heat transport amount of the vapor chamber of No. 1, which used a flow path mesh having a narrow aperture of 100 mesh instead of the supporting column members of the examples, was 10 W, the maximum heat transport amount of the vapor chamber of No. 2, which used a flow path mesh of 100 mesh without the first wick structure and the second wick structure, was 15 W, the maximum heat transport amount of the vapor chamber of No. 3, which used a flow path mesh of 100 mesh along with the second wick structure but without the first wick structure, was 20 W, and the maximum heat transport amount of the vapor chamber of No. 4, which used a flow path mesh of 150 mesh along with the second wick structure but without the first wick structure, was 10 W. Each of these vapor chambers showed the maximum heat transport amount of only less than 50% of that obtained from the vapor chambers of the above examples.

The vapor chamber of the present disclosure can prevent dry-out and provide a superior heat transport capability regardless of an installation orientation such as a top heat orientation or a change in the installation orientation, and thus can be used in a variety of fields. For example, the vapor chamber has a high utility value in the field of electronic devices including mobile information terminals and personal computers such as 2-in-1 tablets.

What is claimed is:

1. A vapor chamber comprising:
a container having a hollow portion, the hollow portion being formed by one plate-shaped body and another plate-shaped body facing the one-plate shaped body;
a working fluid enclosed in the hollow portion;
a first wick structure provided in the hollow portion; and
a second wick structure on an inner surface of the one plate-shaped body thermally connected to a heating element, the second wick structure having a lower flow path resistance to the working fluid than the first wick structure, the second wick structure including a groove portion, wherein
a vapor flow path is provided inside of the other plate-shaped body,
the first wick structure is provided between the other plate-shaped body and the second wick structure, and
an aperture size of the first wick structure is 75% or more of a groove width of the second wick structure and an open area rate of the first wick structure is 35% or more, wherein the first wick structure is arranged on the second wick structure,
a supporting column member is provided on an inner surface of the other plate-shaped body so as to protrude from the inner surface of the other plate-shaped body,
at least a portion of the inner surface of the one plate-shaped body is the second wick structure,
the supporting column member contacts the first wick structure and holds in the first wick structure, the first wick structure covering the groove portion of the one plate-shaped body, and
the first wick structure has a function of causing the working fluid in liquid phase to flow back from the heat releasing portion to the heat receiving portion and also a function of retaining a certain amount of the working fluid in liquid phase.

2. The vapor chamber according to claim 1, wherein the second wick structure includes a lattice-shaped groove structure, and the lattice-shaped groove structure is provided on an entire inner surface of the hollow portion, or on a portion of the hollow portion corresponding to a heat receiving portion and/or a portion of the hollow portion corresponding to a heat releasing portion.

3. The vapor chamber according to claim 1, wherein the supporting column member includes a groove extending from a top portion of the supporting column member to a bottom portion of the supporting column member.

4. The vapor chamber according to claim 1, wherein the supporting column member includes a groove helically extending from a top portion of the supporting column member to a bottom portion of the supporting column member.

5. The vapor chamber according to claim 1, wherein the supporting column member includes a lattice-shaped groove on a side surface portion of the supporting column member.

6. A mobile electronic device comprising a heating element thermally connected to the vapor chamber according to claim 1.

* * * * *